United States Patent

Muraki et al.

[11] Patent Number: 5,892,288
[45] Date of Patent: Apr. 6, 1999

[54] SEMICONDUCTOR INTEGRATED CIRCUIT DEVICE

[75] Inventors: Takeshi Muraki; Takayuki Yuyama, both of Tokyo, Japan

[73] Assignee: Mitsubishi Denki Kabushiki Kaisha, Tokyo, Japan

[21] Appl. No.: 996,143

[22] Filed: Dec. 22, 1997

[30] Foreign Application Priority Data

May 30, 1997 [JP] Japan ................................... 9-142128

[51] Int. Cl.$^6$ .............................. H01L 23/48; H01L 23/52
[52] U.S. Cl. ...................... 257/778; 257/774; 257/782; 257/673; 257/690
[58] Field of Search .................................. 257/774, 778, 257/780, 781, 782, 690, 673

[56] References Cited

U.S. PATENT DOCUMENTS

| | | | |
|---|---|---|---|
| 5,583,376 | 12/1996 | Sickler et al. | 257/702 |
| 5,600,180 | 2/1997 | Kusaka et al. | 257/780 |
| 5,726,489 | 3/1998 | Matsuda et al. | 257/778 |
| 5,753,974 | 5/1998 | Masukawa | 257/774 |

FOREIGN PATENT DOCUMENTS 8-307033  11/1996  Japan .

*Primary Examiner*—Peter Toby Brown
*Assistant Examiner*—Hung Van Duong
*Attorney, Agent, or Firm*—McDermott, Will & Emery

[57] ABSTRACT

To provide a slim and miniaturized semiconductor integrated circuit device which eliminates the needs for making through holes and conducting in through holes and uses a carrier substrate with a small thermal expansion coefficient difference from a semiconductor chip. A semiconductor integrated circuit device using a carrier substrate having a plurality of extraction conductive layers 3 formed as a single layer on an insulating base body 11 having a thermal expansion coefficient of $4 \times 10^{-6}$ $C.^{-1}$ to $16 \times 10^{-6}$ $C.^{-1}$ and comprising a plurality of ball-like external connection terminals 7 in a plurality of closed-end holes 15 arriving at external connection parts 4, each of the external connection terminals 7 having a diameter larger than the depth of each of the closed-end holes 15.

11 Claims, 6 Drawing Sheets

SEMICONDUCTOR INTEGRATED CIRCUIT DEVICE

BACKGROUND OF THE INVENTION

1. Field of the Invention

This invention relates to a semiconductor integrated circuit device, for example, having a package structure called a CSP (chip scale package) structure and in particular to a miniaturized and slimmed semiconductor integrated circuit device.

2. Description of the Related Art

In recent years, strict requirements for miniaturization and slimming down of semiconductor integrated circuit devices have been made increasingly with miniaturization and slimming down of electronic machines. To meet the requirements, a package structure called a CSP structure is proposed as one of new miniaturized and slim package structures replacing flat packages of conventional semiconductor integrated circuit device package structures.

The CSP structure, which is a package structure where a reliability guarantee test such as a burn-in test of a semiconductor integrated circuit device can be executed, is suppressed in size almost to a semiconductor chip size; basically it is a structure wherein a semiconductor chip is directly connected to a carrier substrate of almost a chip size instead of connecting a semiconductor chip and a lead frame by conventional wiring bonding.

An example of the structure is described on pages 35–38 of November number 1995 of "Hyoumen jissou gijyutu." FIG. 12 is a sectional view of a semiconductor integrated circuit device shown in the prior art. FIG. 13 shows a carrier substrate. The semiconductor integrated circuit device uses a polyimide film as a base material 18 for a carrier substrate and a circuitry conductive layer consisting of external connection parts 4 and a chip connection part 5 is formed on the surface of the film as a carrier substrate. Further, a conductive pad 8 formed on a semiconductor chip 1 is connected to the chip connection part 5 and the space between the surfaces of the semiconductor chip 1 and the carrier substrate is filled with an elastomer 2 of a rubber material as a thermal expansion coefficient relief material. External connection terminals 7 are placed on the rear face at the position of the external connection parts 4 of the base material 18. The entire dimensions of the semiconductor integrated circuit device are thus set almost to a chip size.

Another example of the structure is described on pages 22–25 of November number 1995 of "Hyoumen jissou gijyutu." FIG. 14 is a sectional view of a semiconductor integrated circuit device shown in the prior art. FIG. 15 shows a carrier substrate. The semiconductor integrated circuit device comprises external connection parts 4 disposed on the rear face and chip connection parts 5 disposed on the surface and uses a ceramic substrate 10 formed with through holes 9 for connecting the external connection parts 4 and the chip connection parts 5 as a carrier substrate. The chip connection part 5 and a conductive pad 8 of the semiconductor chip 1 are connected by a chip connection terminal 14. Each external connection part 4 is provided with an external connection terminal 7. The space between the surfaces of the carrier substrate and the semiconductor chip 1 is filled with a seal resin 12 made of normal thermosetting resin. The entire dimensions of the semiconductor integrated circuit device are thus set almost to a chip size.

However, the semiconductor integrated circuit device shown in FIG. 12 uses a polyimide film as the base material 18 for the carrier substrate. The polyimide film has a thermal expansion coefficient of $60 \times 10^{-6}$ °$C.^{-1}$, which differs largely from the thermal expansion coefficient of the silicon semiconductor chip 1, $4 \times 10^{-6}$° $C.^{-1}$. The semiconductor integrated circuit device shown in FIG. 12 uses the elastomer 2 to relieve the stress produced due to the thermal expansion coefficient difference. Use of the elastomer 2 involves problems of lowering humidity resistance for the semiconductor chip 1, cost increase because of installation of new facilities, cost increase of seal resin, etc. Further, to relieve the heat stress, the conductive pad 8 of the connection part to the carrier substrate needs to be placed at the center of the semiconductor chip 1, for example.

The semiconductor integrated circuit device shown in FIG. 14 comprises the carrier substrate 10 made of alumina of ceramic (thermal expansion coefficient=$8 \times 10^{-6}$° $C.^{-1}$); the thermal expansion coefficient difference between the carrier substrate 10 and the semiconductor chip 1 is comparatively small. Therefore, a special heat stress relief material is not required, the space between the semiconductor chip 1 and the carrier substrate 10 may be filled with the seal resin 12 made of normal thermosetting resin, etc., and the conductive pad 8 of the semiconductor chip 1 corresponding to the chip connection terminal 14 may be placed in the surrounding of the semiconductor 1. However, the through holes 9 need to be made in the carrier substrate 10 made of ceramic and conduction treatment such as plating of the inner walls of the through holes 9 or filling the through holes with a conductive material is required. Moreover, the ceramic material is hard and brittle as compared with the film material, etc., thus a reasonable thickness is required for ensuring reliability; the ceramic material is also disadvantageous from the viewpoint of the entire thickness of the package.

SUMMARY OF THE INVENTION

It is therefore an object of the invention to provide a miniaturized and slim semiconductor integrated circuit device that can be manufactured easily and use a normal thermosetting resin as a seal resin placed between an carrier substrate and a semiconductor chip and in particular to a semiconductor integrated circuit device which eliminates the needs for making through holes in an insulating base body and conducting in through holes and uses an insulating substrate of a thin film shape with a small thermal expansion coefficient difference from a semiconductor chip as the insulating base body.

According to the invention, there is provided a semiconductor integrated circuit device comprising:

a semiconductor chip constituted by a semiconductor substrate and a plurality of conductive pads formed on one major surface of the semiconductor substrate;

a carrier substrate constituted by an insulating base body of an insulating material having a thermal expansion coefficient between that of the semiconductor substrate and that of a printed wiring board to carry the semiconductor integrated circuit device and a plurality of circuitry conductive layers formed as a single layer on the insulating base body in a one-to-one correspondence with the conductive pads of the semiconductor chip and having chip connection parts exposed to a surface of the insulating base body, each of the chip connection parts being electrically connected to the corresponding conductive pad, and external connection parts exposed to a rear face of the insulating base body, the carrier substrate being formed with a plurality of closed-end holes in a one-to-one correspondence with the external connection parts of the circuitry conductive layers, each of the closed-end holes arriving at the corresponding external connection part from the rear face of the insulating base body;

a seal resin placed between the insulating substrate and the semiconductor chip; and a plurality of external connection terminals made of ball-like conductive material and provided in a one-to-one correspondence with the closed-end holes in the insulating substrate, each of the external connection terminals being disposed in the corresponding closed-end hole and connected to the corresponding external connection part for electric connection, wherein the depth of each of the closed-end holes in the insulating base body is smaller than the diameter of each of the external connection terminals.

Preferably the insulating base body is made of an insulating material having a thermal expansion coefficient of $4 \times 10^{-6\circ}$ C.$^{-1}$ to $16 \times 10^{-6\circ}$ C.$^{-1}$.

The single layer forming the circuitry conductive layers is formed on the surface of the insulating base material, and the electric connection of each conductive pad and the chip connection part of the circuitry conductive layer corresponding to the conductive pad is made by a chip connection terminal made of a conductive material.

The single layer forming the circuitry conductive layers is formed in the insulating base body, and the electric connection of each conductive pad and the chip connection part of the circuitry conductive layer corresponding to the conductive pad is made by a chip connection terminal made of a ball-like conductive material disposed in a second closed-end hole arriving at the corresponding chip connection part from the surface of the insulating base body.

The external connection part and the chip connection part in at least one of the circuitry conductive layers are formed on the surface and the rear of the same position.

The seal resin is placed covering the entire semiconductor chip.

The external connection terminals are placed like an array in the insulating base body.

Each of the closed-end holes made in the insulating substrate has a tapering shape with an entrance larger than a bottom.

The insulating base body is made of fiber reinforced plastics.

The fiber reinforced plastics is Aramid fiber reinforced plastics.

The fiber reinforced plastics is glass fiber reinforced plastics.

DESCRIPTION OF THE PREFERRED EMBODIMENTS

Figure 1:
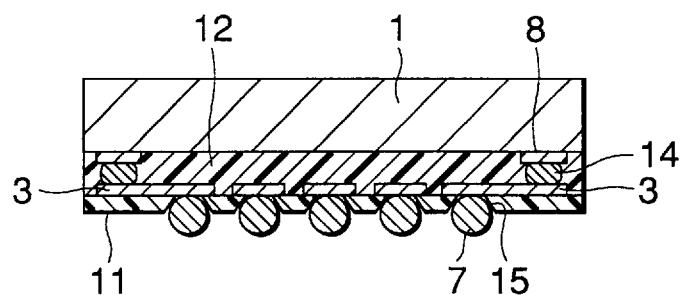
FIG. 1 is a sectional view of a semiconductor integrated circuit device to show a first embodiment of the invention.

Referring now to the accompanying drawings, there are shown preferred embodiments of the invention. Identical or similar parts are denoted by the same reference numerals in the drawings.

Embodiment 1

Figure 2:
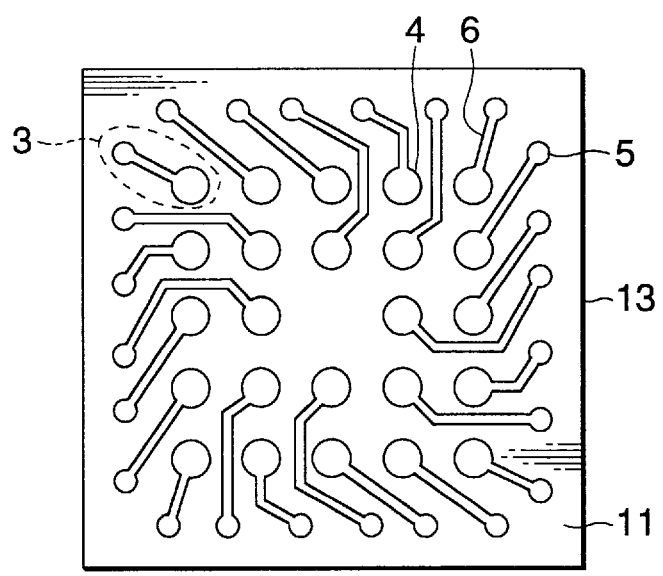
FIG. 2 is a plan view of an carrier substrate 13 of the first embodiment of the invention.

FIGS. 1 and 2 show the configuration of a semiconductor integrated circuit device according to a first embodiment of the invention; FIG. 1 is a sectional view of the semiconductor integrated circuit device and FIG. 2 is a plan view of a carrier substrate 13.

In FIG. 1, numeral 1 is a semiconductor chip having a semiconductor substrate and a plurality of conductive pads 8 formed on one major surface of the semiconductor substrate, and a desired circuit is formed on the one major surface of the semiconductor substrate. Numeral 3 is circuitry conductive layers formed as a single layer on the surface of an insulating base body 11 having a thermal expansion coefficient of $4 \times 10^{-6\circ}$ C.$^{-1}$ to $16 \times 10^{-6\circ}$ C.$^{-1}$, which will be hereinafter referred to as the low thermal expansion insulating base body, the circuitry conductive layers 3 are provided in a one-to-one correspondence with the conductive pads 8 of the semiconductor chip 1. Each circuitry conductive layer 3 is made up of an external connection part 4, a chip connection part 5, and a wiring part 6 connecting the parts. The low thermal expansion insulating base body 11 and the circuitry conductive layers 3 make up the carrier substrate 13.

Numeral 14 is chip connection terminals provided in a one-to-one correspondence with the conductive pads 8 of the semiconductor chip 1. Each chip connection terminal 14 is placed between the corresponding conductive pad 8 of the semiconductor chip 1 and the corresponding chip connection part 5 exposed to the surface of the low thermal expansion insulating base body 11 for electrically conducting and physically connecting the conductive pad 8 and the chip connection part 5. Numeral 12 is a seal resin made of a thermosetting resin for filling and protecting the space between one major surface of the semiconductor chip 1 and the surface of the carrier substrate 13. Numeral 15 is closed-end holes provided in a one-to-one correspondence with the circuitry conductive layers. Each closed-end hole 15 is made in the rear face of the carrier substrate 13 so as to arrive at the corresponding external connection part 4 and penetrates the low thermal expansion insulating base body 11, the bottom forming the corresponding external connection part 4. Numeral 7 is external connection terminals made of ball-like conductive material, provided in a one-to-one correspondence with the closed-end holes, each of the external connection terminals being disposed in the corresponding closed-end hole 15 and connected to the corresponding external connection part 4 for electric connection.

The featuring components in the first embodiment will be discussed in more detail.

Carrier Substrate 13

The low thermal expansion insulating base body 11 forming a part of the carrier substrate 13 is made of an insulating substance having a thermal expansion coefficient ranging from $4 \times 10^{-6 \circ}$ C.$^{-1}$ to $16 \times 10^{-6 \circ}$ C.$^{-1}$ as described above. Thus, a problem is scarcely caused by the thermal expansion coefficient difference between the low thermal expansion insulating base body 11 and the semiconductor chip 1 although the low thermal expansion insulating base body 11 of the carrier substrate 13 is connected to the semiconductor chip 1 via the chip connection parts 5, the conductive pads 8, and the chip connection terminals 14.

To use an insulating substance having a thermal expansion coefficient of $16 \times 10^{-6 \circ}$ C.$^{-1}$ or more as the low thermal expansion insulating base body 11, the heat stress occurring between the low thermal expansion insulating base body 11 and the semiconductor chip 1 made of silicon grows to the extent that it cannot be ignored, and chip cracks, etc., occur on some of the semiconductor chips 1. To use an insulating substance having a thermal expansion coefficient of lower than $4 \times 10^{-6 \circ}$ C.$^{-1}$ as the low thermal expansion insulating base body 11, a heat stress occurs little between the carrier substrate 13 as the carrier substrate and the semiconductor chip 1 and chip cracks, etc., do not occur on the semiconductor chips 1, but a large heat stress occurs between the carrier substrate 13 and the printed wiring board on which the semiconductor integrated circuit device is mounted, and cracks, etc., occur on the external connection terminals in some cases.

An insulating film 0.01–0.2 mm thick is used as the low thermal expansion insulating base body 11. The package structure can be made very thin by using such a thin insulating film.

Insulating films thinner than 0.01 mm lower in reliability of strength and are not practical.

In the first embodiment, a fiber reinforced plastics base material is used as a specific example forming the low thermal expansion insulating base body 11.

Reinforcing fiber having excellent mechanical strength and rigidity formed of an inorganic or organic compound is fixed by thermoplastics or thermosetting plastics, thereby providing the fiber reinforced plastics (FRP).

Glass cloth provided by making long fiber of E glass plain cloth and an epoxy resin of thermosetting plastics are used as a specific example of the fiber reinforced plastics. To use the materials, the fiber reinforced plastics having a thermal expansion coefficient ranging from $10 \times 10^{-6 \circ}$ C.$^{-1}$ to $16 \times 10^{-6 \circ}$ C.$^{-1}$ is preferred.

The fiber reinforced plastics has a thermal expansion coefficient close to the thermal expansion coefficient $4 \times 10^{-6}$ of the silicon semiconductor chip 1. Thus, to apply the fiber reinforced plastics to the low thermal expansion insulating base body 11 of the carrier substrate 13, a heat stress is scarcely caused by the thermal expansion coefficient difference between the low thermal expansion insulating base body 11 and the semiconductor chip 1 and cracks, etc., do not occur on the semiconductor chips 1. To mount the semiconductor integrated circuit device thus configured on a printed wiring board, a heat stress caused by the thermal expansion coefficient difference between the semiconductor integrated circuit device and the printed wiring board is imposed on the external connection terminals 7, but cracks, etc., do not occur thereon.

The reason why the lower limit of the thermal expansion coefficient of the fiber reinforced plastics base material is set to $10 \times 10^{-6 \circ}$ C.$^{-1}$ or more is that if an attempt is made to set the lower limit of the thermal expansion coefficient less than the value, the resin component must be extremely lessened, the strength of the fiber reinforced plastics base material itself is lost, and the heat stress caused by the thermal expansion coefficient difference between the semiconductor integrated circuit device and the printed wiring board causes cracks, etc., to occur on the low thermal expansion insulating base body 11.

Aramid cloth provided by making long fiber of Aramid plain cloth and an epoxy resin are used as another specific example of the fiber reinforced plastics. To use the materials, the fiber reinforced plastics having a thermal expansion coefficient ranging from $4 \times 10^{-6 \circ}$ C.$^{-1}$ to $10 \times 10^{-6 \circ}$ C.$^{-1}$ is preferred.

The fiber reinforced plastics has a thermal expansion coefficient close to the thermal expansion coefficient of the silicon semiconductor chip 1. Thus, a heat stress scarcely occurs between the low thermal expansion insulating base body 11 and the semiconductor chip 1 and cracks, etc., do not occur on the semiconductor chips 1. To mount the semiconductor integrated circuit device thus configured on a printed wiring board, a heat stress caused by the thermal expansion coefficient difference between the semiconductor integrated circuit device and the printed wiring board is imposed on the external connection terminals 7, but cracks, etc., do not occur thereon.

Since long fiber of Aramid having a low thermal expansion coefficient $-1 \times 10^{-6 \circ}$ C.$^{-1}$ is used as the fiber reinforced plastics base material, the base material having a low thermal expansion coefficient can be formed as compared with the base material with glass fiber. However, if the thermal expansion coefficient is set to less than $4 \times 10^{-6 \circ}$ C.$^{-1}$ as the fiber reinforced plastics, the resin component must be extremely lessened and the strength of the fiber reinforced plastics base material itself is lost. If the thermal expansion coefficient is set to less than $4 \times 10^{-6 \circ}$ C.$^{-1}$, the thermal expansion coefficient difference between the semiconductor integrated circuit device and the printed wiring board becomes too large and cracks, etc., occur on the external connection terminals 7.

The fiber reinforced plastics base materials are not limited to the above-given examples; for example, they may be fiber reinforced plastics with short fiber such as glass chop or Aramid chop. Also in this case, the blend ratio of fiber and resin needs to be adjusted for setting the thermal expansion coefficient of the fiber reinforced plastics base material in the range of $4 \times 10^{-6 \circ}$ C.$^{-1}$ to $16 \times 10^{-6 \circ}$ C.$^{-1}$ as described above.

Epoxy resin is used as the resin of the fiber reinforced plastics base material; a thermosetting resin of unsaturated polyester, epoxy, etc., or a thermoplastics resin of polyester, etc., usually used may be used intact. However, the epoxy resin is preferred from the viewpoints of heat resistance, humidity resistance, etc.

Very thin film 0.01–0.2 mm thick is used as the fiber reinforced plastics base material described above; it is very tough as compared with ceramic substrates and serves a sufficient carrier substrate function.

Closed-End Hole 15 in Carrier Substrate 13

Each closed-end hole 15 in the carrier substrate 13 penetrates the low thermal expansion insulating base body 11 and forms the corresponding external connection part 4 at the bottom. The closed-end hole 15 may be made by usual drilling; in the first embodiment, it is formed using a laser like a tapering shape with the entrance larger than the bottom.

For example, to use a glass fiber reinforced plastics base material 0.1 mm thick as the low thermal expansion insulating base body 11, the closed-end hole 15 made by laser beam machining is provided by applying six shots of $CO_2$ laser of pulse energy 12.3–12.8 mJ and pulse width 16 $\mu$sec. At this time, the external connection part 4 becoming the bottom of the closed-end hole 15 is made of a conductive metal such as copper or gold, thus the $CO_2$ laser is reflected on the external connection part 4. Resultantly, the external connection part 4 is not broken, control in the depth direction is made unnecessary, and the closed-end hole with a good internal wall work face can be made.

Figure 10:
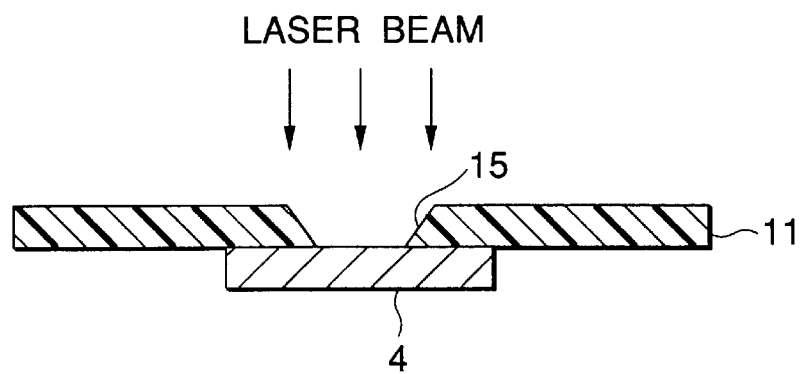
FIG. 10 is a sectional view to explain a closed-end hole 15 made by laser beam machining of the invention.

Moreover, the closed-end hole 15 in the carrier substrate 13 made by laser beam machining has a shape proper to the laser beam machining, namely, a tapering shape with the entrance open as compared with the bottom or the exposed face of the external connection part, as shown in FIG. 10.

Figure 11:
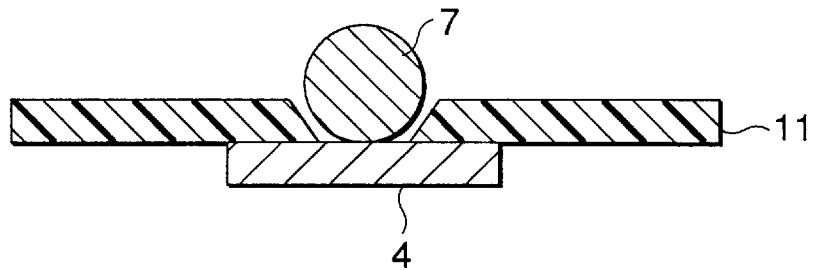
FIG. 11 is a sectional view to show a state in which an external connection terminal 7 made of a solder ball is disposed in the closed-end hole 15 made by laser beam machining of the invention.
Figure 12:
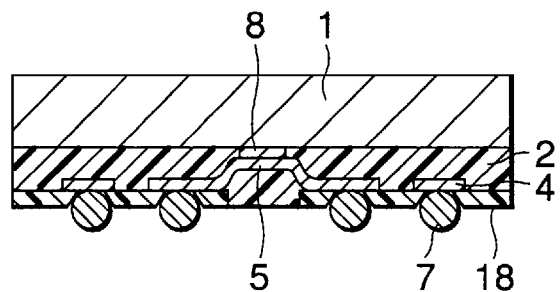
FIG. 12 is a sectional view of a conventional semiconductor integrated circuit device.
Figure 13:
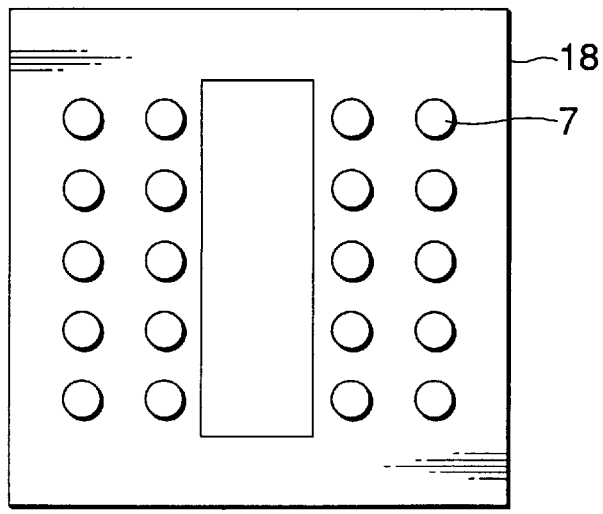
FIG. 13 is a plan view of a carrier substrate in the conventional semiconductor integrated circuit device.
Figure 14:
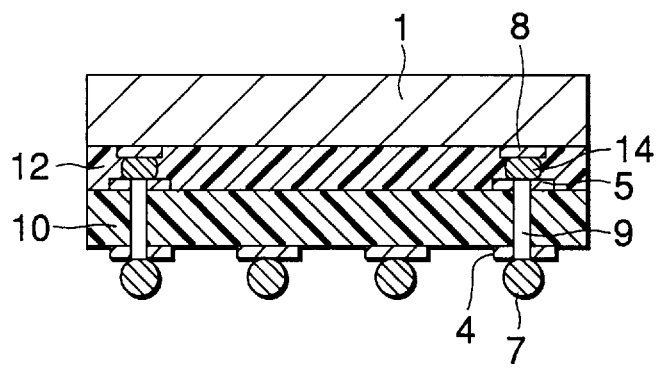
FIG. 14 is a sectional view of another conventional semiconductor integrated circuit device.
Figure 15:
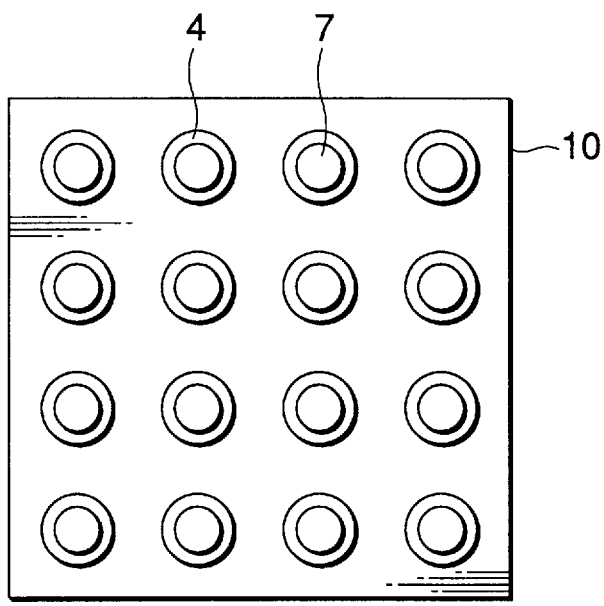
FIG. 15 is a plan view of a carrier substrate in the conventional semiconductor integrated circuit device in FIG. 14.

Such a shape produces the effect of making bubbles hard to remain in the closed-end hole 15 when the external connection terminal 7 made of a ball-like conductive material is disposed in the closed-end hole 15 and then is connected to an external connection part, such as a printed wiring board land, as shown in FIG. 11. The external connection terminal 7 made of a ball-like conductive material needs to have a diameter greater than the depth of the closed-end hole 15 to effectively connect the external connection terminal 7 to the external connection part.

Circuitry Conductive Layer 3

The circuitry conductive layers 3 are provided in a one-to-one correspondence with the conductive pads 8 of the semiconductor chip 1 and are formed on the surface of the low thermal expansion insulating base body 11 as identical layers made of a conductive metal such as copper or gold.

Figure 5:
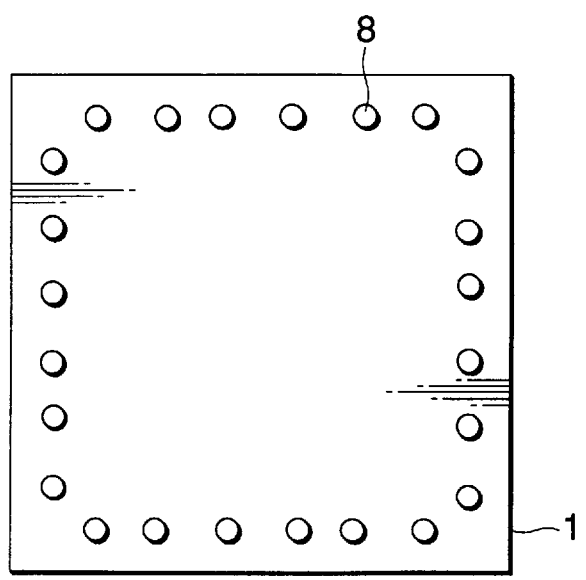
FIG. 5 is a plan view to show a general semiconductor chip 1.

Each circuitry conductive layer 3 is made up of an external connection part 4, a chip connection part 5, and a wiring part 6 connecting the parts, as shown in FIG. 2. The chip connection part 5 of the circuitry conductive layer 3 is connected to the corresponding conductive pad 8 placed in the peripheral portion on one major surface of the semiconductor chip 1 via the corresponding chip connection terminal 14, as shown in FIG. 5.

The external connection part 4 of the circuitry conductive layer 3 is electrically connected to the external connection terminal 7 made of a ball-like conductive material in the closed-end hole 15, as shown in FIG. 11. Preferably, the external connection part 4 is made of a solder ball in connection reliability at the mounting time on a printed wiring board in a later process.

Each conductive pad 8 of the semiconductor chip 1 is thus connected electrically to the external connection terminal 7 via the chip connection terminal 14 and the chip connection part 5, the wiring part 6, and the external connection part 4 of the circuitry conductive layer 3.

The external connection parts 4 of the circuitry conductive layers 3 are placed on the rear face of the low thermal expansion insulating base body 11 most efficiently in accordance with design rules of pitch spacing of the external connection terminals 7, etc.,; they are placed like an array, namely, at intersections like a lattice, as shown in FIG. 2, whereby the semiconductor integrated circuit device is miniaturized.

For the circuitry conductive layer 3, a conductive metal layer is formed on the front of the surface of the low thermal expansion insulating base body 11 by a usually known etching process at the same time. That is, conductive metal foil is put on the surface of the low thermal expansion insulating base body 11, then a predetermined pattern of an etching resist is formed on the conductive metal foil face by a photo engraving process, then etching is performed. After the etching, the etching resist is removed for providing desired circuitry conductive layers 3. To form the circuitry conductive layers 3, a pattern maybe directly formed by plating, vapor deposition, or sputtering instead of putting conductive metal foil.

Chip Connection Terminal 14

Each chip connection terminal 14 is made of a ball-like conductive material for connecting the conductive pad 8 of the semiconductor chip 1 and the chip connection part 5 electrically and physically. In the first embodiment, the chip connection terminals 14 are formed by solder or gold.

Seal Resin 12

The seal resin 21 is made of a thermosetting resin, specifically an epoxy resin, a modified epoxy resin, a silicone resin, or a modified silicone resin.

The semiconductor integrated circuit device thus configured produces the following effects:

First, the insulating base body 11 having a thermal expansion coefficient of $4\times10^{-6\circ}$ $C.^{-1}$ to $16\times10^{-6\circ}$ $C.^{-1}$, specifically an insulating film 0.01–0.2 mm thick made of a fiber reinforced plastics material is used as the carrier substrate 13 functioning as a carrier substrate, so that the semiconductor integrated circuit device can be slimmed and miniaturized.

Second, the closed-end holes 15 having the bottoms forming the external connection parts 4 of the circuitry conductive layers 3 are made in the insulating base body 11 to electrically connect the conductive pads 8 of the semiconductor chip 1 and the external connection terminals 7, thus the needs for making through holes in the insulating base body and conducting in through holes can be eliminated for simplifying and facilitating manufacturing of the semiconductor integrated circuit device.

Third, since the thermal expansion coefficient difference between the insulating base body 11 forming a part of the carrier substrate 13 and the semiconductor chip 1 is small, a thermosetting resin of an epoxy resin, etc., can be used as the seal resin 12 placed between the surface of the carrier substrate 13 and one major surface of the semiconductor chip 1; a semiconductor integrated circuit device inexpensive and excellent in humidity resistance for the semiconductor chip 1 is provided.

Fourth, the insulating base body 11 forming a part of the carrier substrate 13 is formed of an insulating film made of fiber reinforced plastics, whereby strong insulating base body 11 is provided; when it is mounted on a printed wiring board, a heat stress based on the thermal expansion coefficient difference between the insulating base body 11 and the printed wiring board does not cause cracks, etc., to occur on the insulating base body 11.

Fifth, each of the closed-end holes 15 made in the carrier substrate 13 has a tapering shape with the entrance larger than the bottom. Thus, when the external connection terminals 7 made of a ball-like conductive material are disposed in the closed-end holes 15 and then are connected to external connection parts, such as printed wiring board lands, bubbles are made hard to remain in the closed-end holes 15, improving the reliability of the electric connection of the external connection parts 4 of the circuitry conductive layers 3 and the external connection terminals 7.

Embodiment 2

Figure 3:
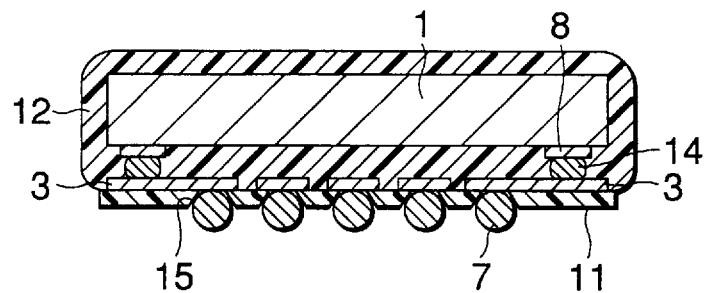
FIG. 3 is a sectional view of a semiconductor integrated circuit device to show a second embodiment of the invention.

FIG. 3 shows a semiconductor integrated circuit device of a second embodiment of the invention.

The semiconductor integrated circuit device of the second embodiment differs from that of the first embodiment in that only the space between the one major surface of the semiconductor chip 1 and the surface of the carrier substrate 13 is filled with the seal resin 12 in the first embodiment; whereas, the surroundings of a semiconductor chip 1 are also covered with a seal resin 12 in the second embodiment. Parts identical with or similar to those previously described with reference to FIG. 1 to show the first embodiment are denoted by the same reference numerals in FIG. 3.

The semiconductor integrated circuit device thus configured also has the sixth effect of enabling a reliability guarantee test such as a burn-in test (heating test of 150° C.) to be executed because the whole semiconductor chip 1 is covered with the seal resin 12 in addition to producing similar effects to those of the first embodiment described above.

Embodiment 3

Figure 4:
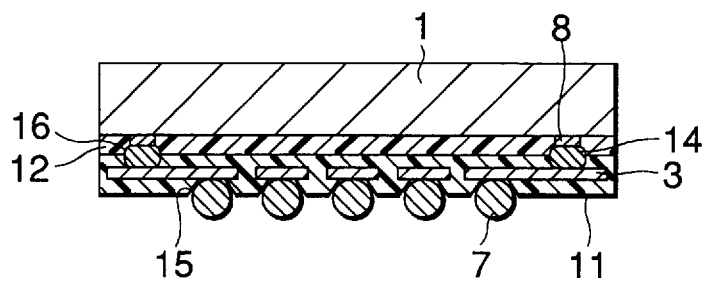
FIG. 4 is a sectional view of a semiconductor integrated circuit device to show a third embodiment of the invention.

FIG. 4 shows a semiconductor integrated circuit device of a third embodiment of the invention.

The semiconductor integrated circuit device of the third embodiment differs from that of the first embodiment in that the single layer forming the circuitry conductive layers 3 is formed on the surface of the low thermal expansion insulating base body 11 in the first embodiment; whereas, a single layer forming circuitry conductive layers 3 is formed in a low thermal expansion insulating base body 11 in the third embodiment. Parts identical with or similar to those previously described with reference to FIG. 1 to show the first embodiment are denoted by the same reference numerals in FIG. 4.

That is, an carrier substrate 13 has a low thermal expansion insulating base body 11 having a thermal expansion coefficient of $4 \times 10^{-6°}$ C.$^{-1}$ to $16 \times 10^{-6°}$ C.$^{-1}$ and a plurality of circuitry conductive layers 3 formed as a single layer in the low thermal expansion insulating base body 11 and provided in a one-to-one correspondence with conductive pads 8 of a semiconductor chip 1.

Each circuitry conductive layer 3 has a chip connection part 5 electrically connected to the corresponding conductive pad 8 and exposed to the surface of the low thermal expansion insulating base body 11, an external connection part 4 exposed to the rear face of the low thermal expansion insulating base body 11, and a wiring part 6 electrically connecting the parts.

The carrier substrate 13 is formed with first closed-end holes 15 provided in a one-to-one correspondence with the external connection parts 4 of the circuitry conductive layers 3 and arriving at the corresponding external connection parts 4 from the rear face of the low thermal expansion insulating base body 11 and second closed-end holes 16 provided in a one-to-one correspondence with the chip connection parts 5 of the circuitry conductive layers 3 and arriving at the corresponding chip connection parts 5 from the surface of the low thermal expansion insulating base body 11.

Each external connection terminal 7 is made of a ball-like conductive material disposed in the first corresponding closed-end hole 15 and connected to the corresponding external connection part 4 for electric connection.

The depth of each of the first closed-end holes 15 in the carrier substrate 13 is smaller than the diameter of each of the external connection terminals 7.

Each chip connection terminal 14 is made of a ball-like conductive material disposed in the second corresponding closed-end hole 16 and connected to the corresponding chip connection part 5 for electric connection.

The conductive material forming each chip connection terminal 14 may be the same as the conductive material forming each external connection terminal 7.

The depth of each of the second closed-end holes 16 in the carrier substrate 13 is smaller than the diameter of the chip connection terminal 14.

The carrier substrate 13 is manufactured as follows: First, conductive metal foil is put on the full surface of a first low thermal expansion insulating base body, for example, a fiber reinforced plastics base body 0.05–0.1 mm thick, then a predetermined pattern of an etching resist is formed on the conductive metal foil face by a photo engraving process, then etching is performed. After the etching, the etching resist is removed for providing desired circuitry conductive layers 3. A second low thermal expansion insulating base body, for example, a fiber reinforced plastics base body 0.05–0.1 mm thick is superposed on the full face of the first low thermal expansion insulating base body where the circuitry conductive layers 3 are formed, providing an carrier substrate 13.

In the semiconductor integrated circuit device, the first and second low thermal expansion insulating base bodies make up the low thermal expansion insulating base body 11 and the circuitry conductive layers 3 are embedded in the low thermal expansion insulating base body 11.

The semiconductor integrated circuit device thus configured also has the seventh effect of improving reliability to prevent flaking, a broken line, etc., from occurring in the external connection parts 4, the chip connection parts 5, or the wiring parts 6 at the connecting time to the semiconductor chip 1 or at the filling time with a seal resin 12 because the circuitry conductive layers 3 having the wiring parts 6, the external connection parts 4, and the chip connection parts 5 are covered with the first and second low thermal expansion insulating base bodies in addition to producing similar effects to those of the first embodiment described above.

Embodiment 4

Figure 6:
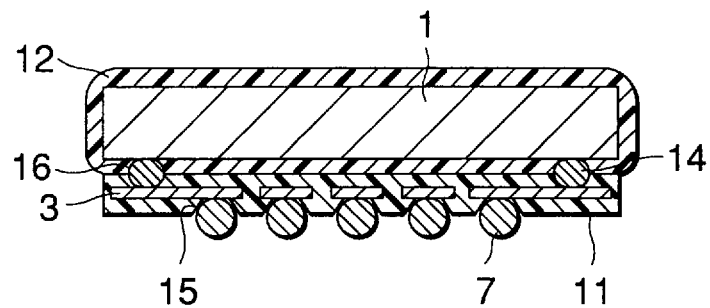
FIG. 6 is a sectional view of a semiconductor integrated circuit device to show a fourth embodiment of the invention.

FIG. 6 shows a semiconductor integrated circuit device of a fourth embodiment of the invention.

The semiconductor integrated circuit device of the fourth embodiment differs from that of the third embodiment in that only the space between the one major surface of the semiconductor chip 1 and the surface of the carrier substrate 13 is filled with the seal resin 12 in the third embodiment; whereas, the surroundings of a semiconductor chip 1 are also covered with a seal resin 12 in the fourth embodiment. Parts identical with or similar to those previously described with reference to FIG. 4 to show the third embodiment are denoted by the same reference numerals in FIG. 6.

The semiconductor integrated circuit device thus configured also produces the sixth effect in addition to the first to fifth effects and the seventh effect as in the third embodiment described above.

Embodiment 5

Figure 7:
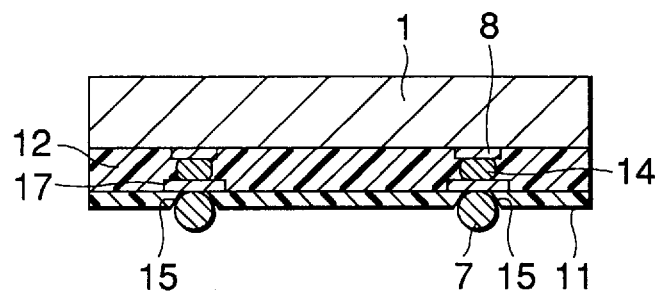
FIG. 7 is a sectional view of a semiconductor integrated circuit device to show a fifth embodiment of the invention.
Figure 8:
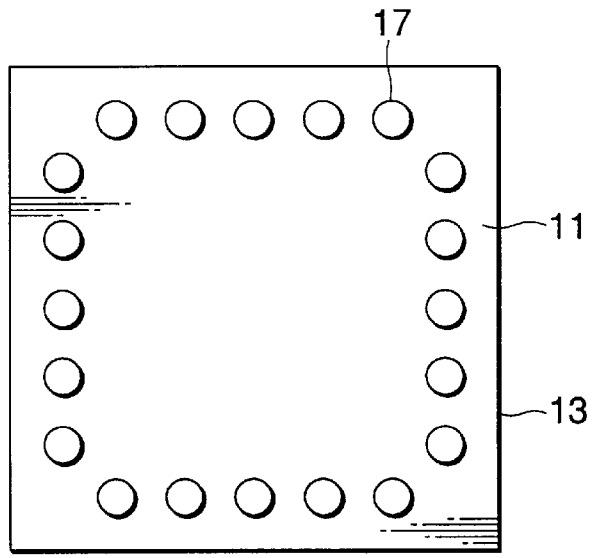
FIG. 8 is a plan view of an insulating substrate 13 of the fifth embodiment of the invention.

FIGS. 7 and 8 show a semiconductor integrated circuit device of a fifth embodiment of the invention.

The semiconductor integrated circuit device of the fifth embodiment differs from that of the first embodiment in that the external connection part 4 and the chip connection part 5 are formed at different positions in each circuitry conductive layer 3 in the first embodiment; whereas, an external connection part 4 and a chip connection part 5 are formed on the surface and the rear of the same position in the fifth embodiment. Parts identical with or similar to those previously described with reference to FIG. 1 to show the first embodiment are denoted by the same reference numerals in FIGS. 7 and 8.

That is, a low thermal expansion insulating base body 11 is formed on the surface with circuitry conductive layers 17 each having an external connection part 4 and chip connection part 5 in a one-to-one correspondence with conductive pads 8 of a semiconductor chip 1. The circuitry conductive layer 17 also serves as a wiring part 6.

The chip connection part of the circuitry conductive layer 17 exposed to the surface of the low thermal expansion insulating base body 11 is electrically connected to the corresponding conductive pad 8 of the semiconductor chip 1 via a chip connection terminal 14.

The carrier substrate 13 is formed on the rear face with a plurality of closed-end holes 15 provided in a one-to-one correspondence with circuitry conductive layers 3 so as to arrive at the corresponding external connection parts 4. Each closed-end hole 15 penetrates the low thermal expansion insulating base body 11, the bottom forming the corresponding external connection part 4.

The external connection part 4 of the circuitry conductive layer 17 exposed to the rear face of the low thermal expansion insulating base body 11 via the closed-end hole is electrically connected to the corresponding external connection terminal 7 disposed in the closed-end hole 15.

The semiconductor integrated circuit device thus configured also has the eighth effect of enabling a decrease in the occupied area of the circuitry conductive layers 3 in the low thermal expansion insulating base body 11 in addition to producing similar effects to those of the first embodiment described above.

Embodiment 6

Figure 9:
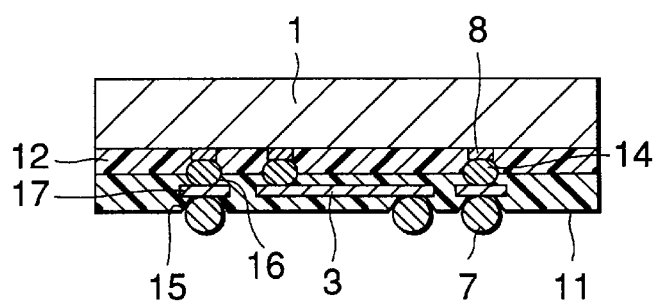
FIG. 9 is a sectional view of a semiconductor integrated circuit device to show a sixth embodiment of the invention.

FIG. 9 shows a semiconductor integrated circuit device of a sixth embodiment of the invention.

The semiconductor integrated circuit device of the sixth embodiment differs from that of the first embodiment in that the single layer forming the circuitry conductive layers 3 is formed on the surface of the low thermal expansion insulating base body 11 in the first embodiment; whereas, a single layer forming circuitry conductive layers 3 is formed in a low thermal expansion insulating base body 11 in the sixth embodiment, and that the external connection part 4 and the chip connection part 5 are formed at different positions in every circuitry conductive layer 3 in the first embodiment; whereas, an external connection part 4 and a chip connection part 5 are formed on the surface and the rear of the same position in each of some of circuitry conductive layers 3 in the sixth embodiment. Parts identical with or similar to those previously described with reference to FIG. 1 to show the first embodiment are denoted by the same reference numerals in FIG. 9.

That is, in an carrier substrate 13, as in the third embodiment, a plurality of circuitry conductive layers are formed as a single layer in the low thermal expansion insulating base body 11, first closed-end holes 15 are made in a one-to-one correspondence with external connection parts of the circuitry conductive layers 3, and second closed-end holes 16 are made in a one-to-one correspondence with chip connection parts 5 of the circuitry conductive layers 3.

Some of the circuitry conductive layers are formed in the circuitry conductive layers 3 each having a chip connection part 5, an external connection part 4, and a wiring part 6, as in the first embodiment. Other circuitry conductive layers are formed by the circuitry conductive layers 17 where the external connection part 4 and the chip connection part 5 are formed on the surface and the rear of the same position, as in the fifth embodiment.

The semiconductor integrated circuit device thus configured also produces the seventh effect and a similar effect to the eighth effect in addition to similar effects to those of the first embodiment described above.

As we have discussed, the invention produces the following effects:

Since the insulating substrate functioning as a carrier substrate for the semiconductor chip comprises the low thermal expansion insulating base body and the circuitry conductive layers having the external connection parts, the chip connection parts, and the wiring parts for connecting the parts, formed as a single layer in the insulating base body, a slim and miniaturized semiconductor integrated circuit device can be provided.

To electrically connect the conductive pads 8 of the semiconductor chip 1 and the external connection terminals 7, the closed-end holes 15 having the bottoms forming the external connection parts 4 of the circuitry conductive layers 3 are made in the insulating base body 11, so that the needs for making through holes in the insulating base body and conducting in through holes can be eliminated for simplifying and facilitating manufacturing of the semiconductor integrated circuit device.

The thermal expansion coefficient difference between the semiconductor chip and the insulating substrate is small, and a thermosetting resin can be used as the seal resin filled between one major surface of the semiconductor chip and the surface of the insulating substrate; a semiconductor integrated circuit device inexpensive and excellent in humidity resistance for the semiconductor chip is provided.

If the circuitry conductive layers are formed as a single layer in the low thermal expansion insulating base body, flaking, a broken line, etc., does not occur in the pads or the wiring parts at the chip connecting time or at the filling time with a seal resin, improving reliability.

If the external connection part and the chip connection part are formed on the surface and the rear of the same position as the circuitry conductive layer, the occupied area of the circuitry conductive layers in the low thermal expansion insulating base body can be reduced.

If the closed-end hole made in the insulating base body has a tapering shape with the entrance larger than the bottom, when the external connection terminals made of a ball-like conductive material are disposed in the closed-end holes and then are connected to external connection parts, such as printed wiring board lands, bubbles are made hard to remain in the closed-end holes.

If the space between the surface of the insulating base body and one major surface of the semiconductor chip is filled with the seal resin and the whole face of the semiconductor chip is also covered with the seal resin, a reliability guarantee test such as a burn-in test can be executed.

If the low thermal expansion insulating base body forming the insulating substrate is made of fiber reinforced plastics, the heat stress occurring between the low thermal expansion insulating base body and the semiconductor chip can be lessened and the carrier substrate can be thinned.

If Aramid fiber reinforced plastics is used as the fiber reinforced plastics, the heat stress occurring between the low thermal expansion insulating base body and the semiconductor chip can be lessened.

If glass fiber reinforced plastics is used as the fiber reinforced plastics, the heat stress occurring between the low thermal expansion insulating base body and the semiconductor chip can be lessened.

What is claimed is:

1. A semiconductor integrated circuit device comprising:

a semiconductor chip including a semiconductor substrate and a plurality of conductive pads formed on a major surface of said semiconductor substrate;

a carrier substrate including (a) an insulating body, a thermal expansion coefficient of said insulating body is the value between that of the semiconductor substrate and that of a printed wiring board carrying the semiconductor integrated circuit device, and (b) a plurality of circuitry conductive layers corresponding to said plurality of conductive pads respectively, and formed as a single layer on or in said insulating body, each circuitry conductive layer has a chip connection part exposed to the surface of said insulating body and connected to the corresponding conductive pad, and a external connection part exposed to the rear face of said insulating body, wherein said carrier substrate has a plurality of closed-end holes corresponding to the external connection part of said plurality of circuitry conductive layers, each closed-end holes arrives at the corresponding external connection part from the rear face of said insulating body;

a seal resin provided between said carrier substrate and said semiconductor chip; and a plurality of ball-like external conductive terminals corresponding to said plurality of closed-end holes, each ball-like external conductive terminal is disposed in the corresponding closed-end hole and electrically connected to the external connection part of the corresponding circuitry conductive layer, wherein a depth of each of said closed-end holes is smaller than a diameter of each of said external conductive terminals.

2. The semiconductor integrated circuit device according to claim 1, wherein the thermal expansion coefficient of said insulating body is the value from $4 \times 10^{-6\circ}$ $C.^{-1}$ to $16 \times 10^{-6\circ}$ $C.^{-1}$.

3. The semiconductor integrated circuit device as claimed in claim 1, wherein the single layer forming said plurality of circuitry conductive layers is formed on the surface of said insulating base body, and each conductive pad and said chip connection part of said circuitry conductive layer corresponding to the conductive pad are connected electrically through a chip connection terminal made of a conductive material.

4. The semiconductor integrated circuit device according to claim 1 wherein said single layer for said plurality of circuitry conductive layers formed on the surface of said insulating body, and said chip connection part of said circuitry conductive layer and the corresponding conductive pad are connected electrically by a ball-like chip connection conductive terminal, said ball-like chip connection conductive terminal is disposed in a second closed-end hole arrived at the corresponding chip connection part from the surface of said insulating body.

5. The semiconductor integrated circuit device according to claim 1 wherein said external connection part and said chip connection part in at least one of said plurality of circuitry conductive layers are placed at a surface and a rear of the same position.

6. The semiconductor integrated circuit device according to claim 1, wherein said seal resin is disposed covering the entire surface of said semiconductor chip.

7. The semiconductor integrated circuit device according to claim 1, wherein said plurality of ball-like external conductive terminals are arranged in an array on said insulating body.

8. The semiconductor integrated circuit device according to claim 1, wherein each of said plurality of first closed-end holes formed in said carrier substrate is a shape with an entrance larger than a bottom.

9. The semiconductor integrated circuit device according to claim 1 wherein said insulating body is made of fiber reinforced plastics.

10. The semiconductor integrated circuit device according to claim 9 wherein said fiber reinforced plastics is aramid fiber reinforced plastics.

11. The semiconductor integrated circuit device according to claim 9 wherein said fiber reinforced plastics is glass fiber reinforced plastics.

* * * * *